United States Patent [19]
Peterson et al.

[11] Patent Number: 5,638,506
[45] Date of Patent: Jun. 10, 1997

[54] METHOD FOR LOGICALLY ISOLATING A CACHE MEMORY BANK FROM A MEMORY BANK GROUP

[75] Inventors: Gregory W. Peterson, Lyons; Leonard J. Kurzawa, Broomfield, both of Colo.

[73] Assignee: Storage Technology Corporation, Louisville, Colo.

[21] Appl. No.: 682,140

[22] Filed: Apr. 8, 1991

[51] Int. Cl.⁶ .................................................. G06F 11/20
[52] U.S. Cl. .............................. 395/182.06; 395/183.18; 395/182.05
[58] Field of Search ............................. 395/400, 425; 369/200, 900; 365/230.04; 364/232.7, 245.31, 970.5

[56] References Cited

U.S. PATENT DOCUMENTS

| | | | |
|---|---|---|---|
| 4,513,372 | 4/1985 | Ziegler et al. | 395/405 |
| 4,675,808 | 6/1987 | Grinn et al. | 395/421.01 |
| 4,809,234 | 2/1989 | Kuwashiro | 365/230.03 |
| 5,003,506 | 3/1991 | Itaya | 395/497.03 |
| 5,042,003 | 8/1991 | Belt et al. | 395/402 |

*Primary Examiner*—Tod R. Swann
*Assistant Examiner*—J. Peikari
*Attorney, Agent, or Firm*—Duft, Graziano & Forest, P.C.

[57] ABSTRACT

A method is described for logically isolating a cache memory bank from the other cache memory banks, as well as from the associated disk drive system and the computer system, while allowing effective use of the remaining cache banks. Linked lists of pointers to free space in a given cache bank are located entirely within the bank; therefore, failure of, or removal of, a cache bank does not prevent the computer and disk drive system from utilizing the free space in the remaining banks. The implementation of the method is such that initialization of all cache memory banks may also be efficiently performed.

8 Claims, 2 Drawing Sheets

METHOD FOR LOGICALLY ISOLATING A CACHE MEMORY BANK FROM A MEMORY BANK GROUP

FIELD OF THE INVENTION

This invention relates generally to computer data storage systems with cache memory, particularly those systems having relatively slow-access primary memory systems, such as disk drives, and more particularly, to a method for isolating a failed cache memory bank from the other cache banks and from a disk drive or other memory system.

Problem

In order to improve system performance, many disk drive systems have associated cache memory subsystems to reduce the average time necessary for a computer system to access data stored on the rotating media. Frequently accessed data is stored in a cache memory buffer, because access to the data in cache memory is significantly faster than access to the same data on rotating media. Cache memory is typically divided into a series of "banks" which are physically separate entities, but logically associated from the standpoint of both the computer system and the disk drive system. In order to efficiently utilize the space in cache memory, prior art systems have kept linked lists of cache space ("free space") available for buffering data read from the disk drive system. These lists are fragmented throughout cache memory; that is, the lists are linked or chained together by pointers, and many of the lists often have pointers to space in a cache memory bank other than the bank in which the lists reside.

In prior art systems, if a cache bank fails, the system has no efficient way of determining where the remaining available free cache space is located, as the chain of pointers is typically broken when a cache bank fails. The fact that the pointers reside within the cache space itself means that the cache space for the entire memory could be lost if any one bank is lost.

Solution

The present invention solves the above problems and achieves a technical innovation in the field by providing a method for logically isolating a cache memory bank from the other cache memory banks, as well as from the associated disk drive system and the computer system, while allowing effective use of the remaining banks.

In order to facilitate finding free space, the present invention uses linked lists of free space pointers, as in the prior art. However, unlike the prior art, the implementation of the present invention is such that all free space pointers associated with a given cache bank are located entirely within the bank; therefore, no free space pointers in any given bank point to any free space in any other cache bank. In the present invention, the linked lists of cache free space pointers are in the form of data stacks referred to as "free memory stacks," which are contained in larger subdivisions of cache memory called "data blocks."

Unused cache memory free space is segmented into fixed size data blocks ("free data blocks") which are used to temporarily store data read from the data storage system. A bank connection table for managing the free space in the cache banks is kept in non-cache memory ("shared memory") shared by both the cache subsystem and the computer system. The bank connection table has an entry for each cache bank, and indicates (1) whether the bank is connected to the computer system and disk system, (2) the number of free data blocks in the associated bank, and (3) where the head of the linked list of pointers in shared memory is located. It is advantageous to have this information in shared memory, as access to memory shared with the computer system is faster than access to cache memory. The method of the present invention employs a plurality of tables of available memory space, hereinafter referred to as "free memory stacks", each of which contains pointers to free data blocks within each cache bank, with none of the pointers in a given bank linked to any other banks. Each free data block pointer points to a different free data block within the bank, in effect providing a large stack of pointers in the bank indicating the locations of free data blocks within the same bank. The bank connection table in shared memory contains pointers to a pair of stacks, each of the pair containing a pointer to the first free data block in the associated cache memory bank. The pair of stacks allows efficient management of the cache memory free space, by allowing the contents of one stack to be written to or read from cache, while the other stack is being used for the allocation of free space needed by the system. The fact that the stacks are located in shared memory allows free space to be located more quickly in shared memory than if the search were conducted entirely in cache memory.

The present method also uses a bit map indicating which entries in the bank connection table have a non-zero number of associated free data blocks in cache memory. The bit map allows fast access to those entries in the bank connection table which indicate the availability of free data blocks; that is, entries with a non-zero free data block count can be located without having to search through the table.

Another feature of the present method is a table index indicating which bank connection table entry is currently being used as a source of free data blocks. When the cache free data block count for a bank reaches zero, the table index is incremented to the next table entry having a non-zero free data block count.

A significant advantage of the present invention over the prior art is that the failure of any single cache bank or plurality of banks does not deprive the system of the use of the remaining banks. Upon an indication that a given cache bank is faulty or inoperative, either a system operator or the system itself can cause the system connection indicator flag associated with the bank to be set to a state indicating that the bank has failed. In addition, a bank may be removed from the system for maintenance or replacement purposes without shutting down the system or impairing the use of the other cache banks.

Another advantage of the present method is to provide a means for quickly and efficiently initializing cache memory. This can be accomplished by initializing all free memory stacks for each bank, thus indicating an empty state for all data blocks in the associated cache banks. Because there are typically 128 data blocks associated with a given free memory stack, the present method is more than two orders of magnitude more efficient than a method which individually initializes each data block.

A further advantage of the present method over the prior art is that cache memory may be initialized as a low-priority or background task, since it can be initialized in segments, and does not require initialization of the entire cache at one time.

DETAILED DESCRIPTION

Figure 1:
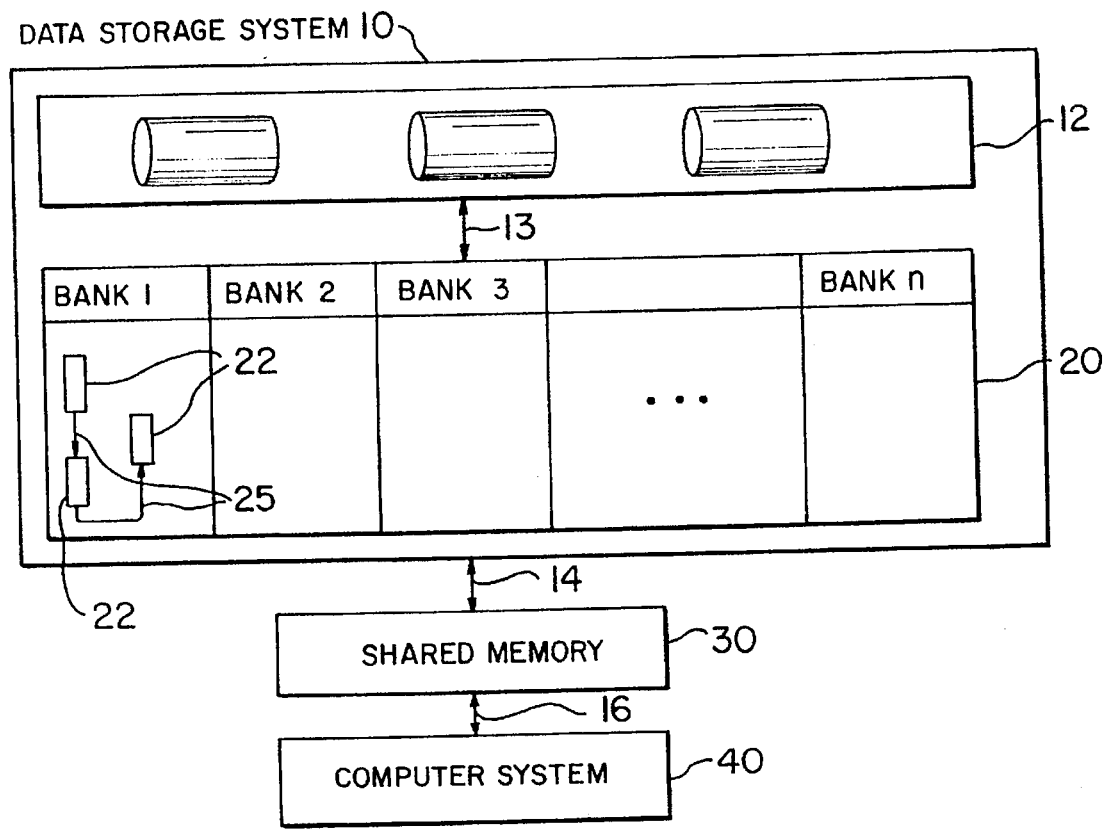
FIG. 1 is a block diagram showing the interrelationship between the data storage system, a cache memory subsystem, shared memory, and a computer system.

FIG. 1 shows a data storage system 10 having a primary memory system 12 and containing a cache memory subsystem 20 having a plurality of ca she memory banks 21 each containing a plurality of free memory stacks 22 linked by link pointers 25. The primary memory system is connected to the cache memory subsystem 20 via bus 13, the cache memory subsystem 20 is connected to shared memory 30 via bus 14, and shared memory 30 is connected via bus 16 to a computer system 40.

Figure 2:
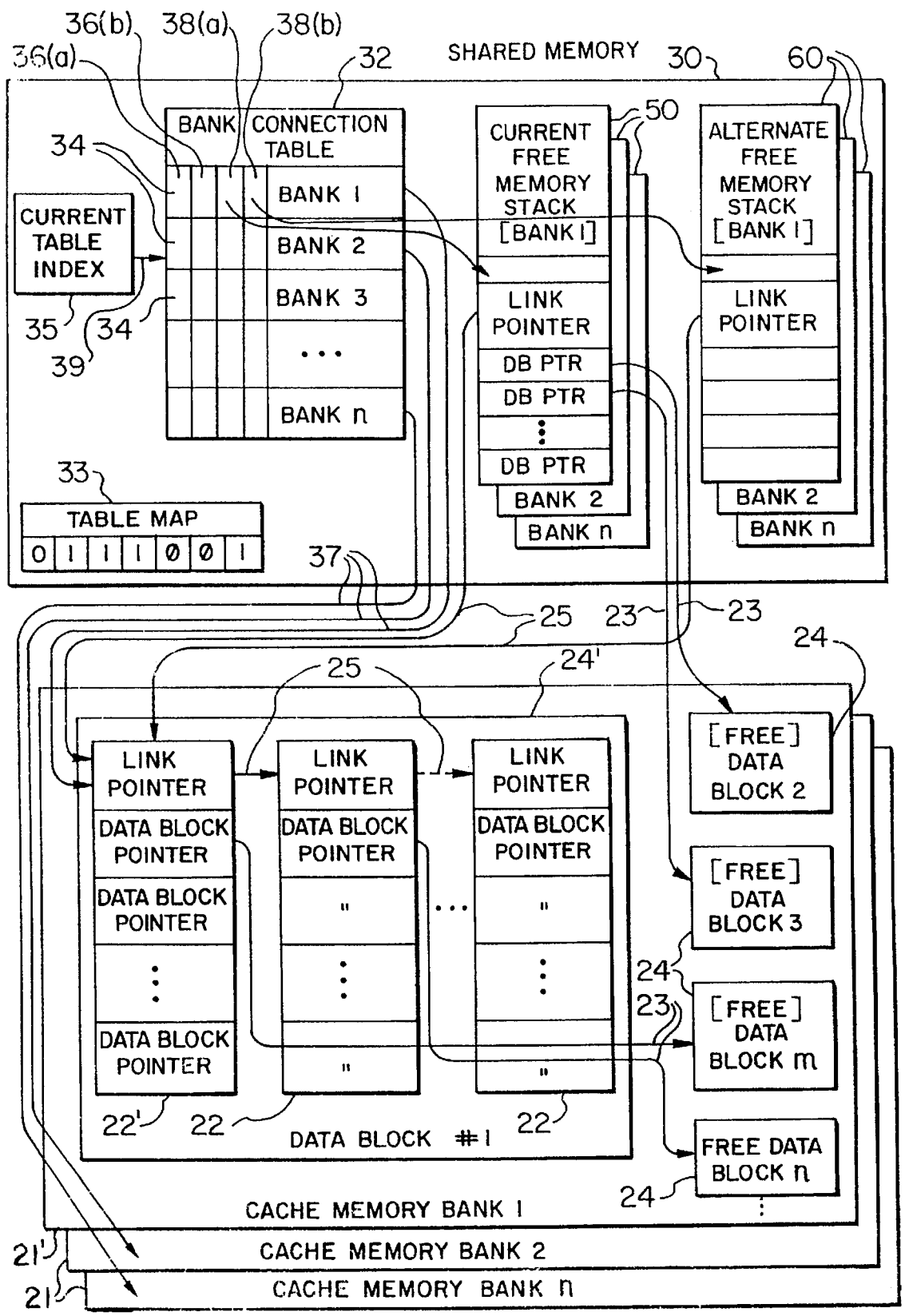
FIG. 2 is a diagram showing the structure and relationship between the bank connection table and free memory stacks in shared memory, and free memory stacks and free data blocks in cache memory.

FIG. 2 shows the relationship between the bank connection table 32 and a pair of free memory stacks 50, 60 in shared memory 30, and data blocks 24 in a cache memory bank 21. Unused cache memory free space is segmented into fixed size free data blocks 24 which are used to temporarily store data read from the data storage system 10. In order to facilitate finding free space, the present invention uses linked lists 50, 60, 22, 22' of pointers 23 to free data blocks. The linked lists 50, 60, 22, 22' of free data block pointers 23 are in the form of data stacks referred to as "free memory stacks" 50, 60, 22, 22' which are contained in larger data blocks 24. All pointers 23 to free data blocks 24 associated with a given cache bank 21 are located entirely within the bank 21; therefore, no free data block pointers 23 in a given bank 21, 21' point to any free data blocks 24 in any other cache bank 21, 21', thus effectively "isolating" the banks 21 from each other. Note theft data block #1 (24') contains a plurality of free memory stacks 22, unlike the remaining illustrated data blocks 24, which are "free" data blocks available for storing either data from the data storage system 10 or for storing additional free memory stacks 22. Each free memory stack 22 is linked to another free memory stack 22 by a link pointer 25. As additional free data blocks 24 accumulate within a cache bank 21, some of them 24' are used for storing free memory stacks 22, 22' containing pointers to the new free data blocks 24.

Shared memory 30 contains a bank connection table 32 having a plurality of entries 34, each entry 34 corresponding to a cache memory bank 21. Each entry 34 in the table 32 contains indicia of connectivity, for example, a pair of flags 36(a) and 36(b), which indicate whether the associated bank 21 (indicated by arrows 37) is logically connected to the rest of the system 10, 30. The use of a pair of flags allows a cache bank 21 to be physically or logically disconnected from the rest of the system 10, 30 while enabling the computer system 40 to have access to all data stored in the remaining banks 21. Each entry 34 in the bank connection table 32 indicates the number of free data blocks 24 in the associated bank 21 and indicates where in shared memory 30 the head of the first free memory stack 22' is located. Each entry in the bank connection table 32 also contains a pointer 38(a) to a current free memory stack 50 and a pointer 38(b) to an alternate free memory stack 60 in shared memory 30. Thus, there are a pair of free memory stacks 50, 60 for every cache data bank 21. The pair of stacks 50, 60 allows efficient management of the cache memory free space, by allowing the contents of one stack to be written to cache memory 20 or read from shared memory 30 while the other stack is being used for the allocation of free space needed by the system 10, 40.

The current free memory stack 50 and the alternate free memory stack 60 each contain a link pointer 25, which points to the first free memory stack 22' in the associated cache memory bank 21. Having a pair of free memory stacks 50, 60 allows one of the stacks to act as a buffer while the other stack is used for either locating or storing pointers to free data blocks. Both the current free memory stack 50 and the alternate free memory stack 60 are identical in structure to the free memory stacks 22, 22' in cache memory 20. Free memory stacks 22, 22' in the cache memory subsystem 20 are linked together with link pointers 25 throughout a given cache bank 21 to form a chain. Each free memory stack 22', 22 in cache memory 20 contains a plurality of pointers 23 to free data blocks 24 in the associated cache bank 21. Each entry in the table 32 also has a cache data block counter (not shown) indicating the number of free cache data blocks 24 in the associated cache bank 21. Initially, each cache data block 24 contains free space which is used for storing data read from the data storage system 10, or for storing free memory stacks 22.

A table map 33 and a current table index 35 are also located in shared memory 30 and used to access the bank connection table 32. The table map 33 is a bit map of bank connection table entries 34 indicating which entries 34 have non-zero cache data block counts. The table map 33 allows fast access to an entry 34 whose associated cache memory bank 21 has free space, by obviating the need for a search through the bank connection table 32. The table map is generated by inspecting flags 36(a) and 36(b) to determine whether the associated bank 21 is logically connected to the rest of the system 10, 30.

The current table index 35 is a pointer which references 39 the entry 34 in the bank connection table 32 which is currently in use and whose associated cache bank 21 contains at least one non-full cache data block 24. When the space in the cache bank 21 associated with the referenced entry 34 is depleted, i.e., when the cache data block counter for the entry is zero, the table index 35 is incremented to the next entry 34 in the bank connection table 32, the index 35 being wrapped to the beginning of the table 32, when necessary.

Adding Free Space to a Cache Bank

As each data block in cache memory 20 becomes available for use (i.e., as it becomes a "free" data block 24), a pointer 23 to its location is stored at the top of the current free memory stack 50 associated with the cache bank 20. When the current free memory stack 50 reaches a maximum threshold number of pointers (before it is full), the alternate free memory stack 60 is checked to determine whether it is empty. If the alternate stack 60 is not empty, its contents (a list of pointers to free data blocks) are written to an empty area in a free data block 24 in the associated cache bank 21, and the alternate stack 60 is then considered to be empty. The alternate free memory stack 60 is emptied in order to ensure that there will be an immediately available free stack for storing new free data blocks when the current free memory becomes totally full. When the current stack 50 becomes full, the alternate free memory stack 60 replaces the old current free memory stack 50, which is then emptied by being written to an empty area in a free data block 24 in the associated cache bank 21. The old current free memory stack 50 then becomes the new alternate free memory stack 60, and because the old alternate/new current stack acts as a buffer, the system 10, 30 does not have to wait for completion of the write operation involving the old current/new alternate stack in order to reference additional free data blocks 24.

Locating Free Space in Cache Memory

When a free data block 24 is required, it is located by referring to the current table index 35, which indicates the entry 34 in the bank connection table 32 for the cache bank 21 currently being used as a source of free data blocks 24. The indicated entry contains a pointer 31 to the current free memory stack 50 associated with the cache bank 21 in which the required free data block 24 is located. The free data block 24 associated with the top entry in the current free memory stack 50 is then made available for use, and the next lower pointer in the stack 50 is popped to the top of the stack 50. When the current free memory stack 50 reaches a minimum threshold number of pointers, the alternate free memory stack 60 is checked to determine whether it is full. If the alternate stack 60 is not full, the first free memory stack 22 in the first free data block 24 is written to the alternate free memory stack 60, the location of the data block 24 being determined by reference to the link pointer 54 in the alternate free memory stack 50. When the current free memory stack 50 becomes empty, the current free memory stack 50 then becomes the new alternate free memory stack 60, and the old alternate free memory stack 60 becomes the new current free memory stack 50. Again, because two free memory stacks 50, 60 are used, the computer system 40 does not have to wait for a stack to be replenished with free data block pointers 24 in order to locate new free space.

Cache Memory Bank Disconnection and Reconnection

Figure 3:
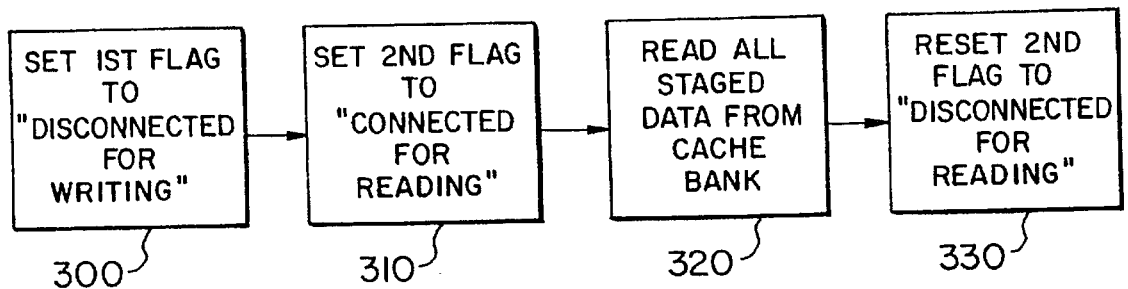
FIG. 3 is a flowchart showing the process of logically disconnecting a cache bank from the system.

FIG. 3 shows the process of logically disconnecting a cache bank 21 from the system 10, 30. Disconnection of a bank 21 without losing any data contained in the bank is accomplished by:

(1) setting, at step 300, the first flag 36(a) to indicate that the cache memory bank 21 is unavailable for writing data thereto;

(2) setting, at step 310, the second flag 36(b) to indicate that the bank 21 is connected to the system 10, 30 and data may be read from the cache bank 21;

(3) reading, at step 320, from the cache bank 21, all the data which is staged to be written to the data storage system 10; and (4) resetting, at step 330, the second flag 36(b) to indicate that the cache bank 21 is unavailable for use, when all the staged data has been written to the computer storage system 10.

After the cache bank 21 has been logically disconnected, the bank 21 may be physically removed for repair or replacement, while the system 10, 30 still is able to use the remaining cache banks 21. The cache bank 21 may be logically reconnected to the system 10, 30 by setting both the first flag 36(a) and the second flag 36(b) to indicate that the bank 21 is available for use. Thus, the failure of any single cache bank 21 or plurality of banks 21 does not deprive the system 10, 40 of the use of the remaining banks 21. Upon an indication that a given cache bank 21 is faulty or inoperative, either a system operator, the data storage system 10, or the computer system 40 can cause the system connection indicator flag 36(a) associated with the bank 21 to be set to a state indicating that the bank 21 has failed. In addition, a bank 21 may be removed from the system 10, 40 for maintenance or replacement purposes without shutting down the system 10, 40 or impairing the use of the other cache banks 21.

Cache Memory Initialization

The present method also provides a means for quickly and efficiently initializing cache memory 20. This can be accomplished by initializing all free memory stacks 50, 60, 22, 22' for each bank 21, thus indicating an empty state for all data blocks 24 in the associated cache banks 21. When the computer system 40 is started-up, it is typically necessary to indicate that all data blocks 24 in a given cache memory bank 21 are available for use, or "empty." Initialization of cache memory 20 provides an indication that all cache data blocks 24 are empty, and also prevents spurious data from being read by the computer system 40. Initialization of a cache memory 20 is accomplished by setting pointers 23, in a sufficient number of free memory stacks 22 in each bank 21 to address all cache data blocks 24 associated with each bank, thereby indicating that all data blocks 24 in all cache banks 21 are "free" data blocks 24.

It is to be expressly understood that the claimed invention is not to be limited to the description of the preferred embodiment but encompasses other modifications and alterations within the scope and spirit of the inventive concept.

We claim:

1. In a data storage system comprised of a relatively slow-access primary memory system and a cache memory subsystem containing a plurality of banks of relatively fast cache memory, said data storage system connected to a shared memory area accessible to said cache memory banks and to a computer system, a method for logically isolating a specified one of said cache memory banks from said data storage system and from all other said cache memory banks in said data storage system, said method comprising the steps of:

creating a table in said shared memory having an entry for each of said cache memory banks, said entry having indicia of connectivity between said data storage system and an associated one of said cache memory banks;

setting said indicia of connectivity for said specified said cache memory bank to indicate a connected state when said specified memory bank is to be connected to said data storage system;

setting said indicia of connectivity for said specified cache memory bank to indicate a disconnected state when said specified memory bank is to be disconnected from said data storage system; and checking said indicia of connectivity in said entry to determine whether said cache memory bank associated with said entry is connected to said data storage system before attempting to transfer data therebetween.

2. The method of claim 1 wherein data is stored in one of said cache memory banks before being written from the computer system to the primary memory system, said indicia of connectivity comprises a first flag and a second flag, and said step of setting said indicia of connectivity to a disconnected state comprises:

(a) setting said first flag to indicate that the specified cache memory bank is unavailable for writing data thereto;

(b) setting said second flag to indicate that data may be read from said specified cache memory bank;

(c) reading all said stored data from said specified cache memory bank to said primary memory system; and (d) resetting said second flag to indicate that said specified cache memory bank is unavailable for reading/writing, when all the stored data has been read therefrom.

3. The method of claim 1 wherein said step of setting said indicia of connectivity to a connected state comprises:

setting both the first flag and the second flag to indicate that the specified bank is available for reading/writing.

4. In a data storage system comprised of a relatively slow-access primary memory system and a cache memory subsystem containing a plurality of banks of relatively fast cache memory, said data storage system connected to a shared memory area accessible to said cache memory banks and to a computer system, a method for logically isolating a specified one of said cache memory banks from said data storage system and from all other said cache memory banks in said data storage system, said method comprising the steps of:

- (a) creating a bank connection table in said shared memory area having a plurality of entries, each of said entries corresponding to a unique one of said cache memory banks and having a storage system connection indicator flag;
- (b) partitioning memory available for use in each said cache memory bank into a plurality of free data blocks;
- (c) allocating, for each of said cache memory banks, a plurality of free memory stacks, a pair of said free memory stacks being located in said shared memory area, and the remainder of said free memory stacks being located in a corresponding cache memory bank;
- (d) linking, within each of said cache memory banks, said first free memory stack to a next free memory stack in said corresponding cache memory bank by storing indicia of location of said next free memory stack in said first free memory stack, the procedure, of linking a said next free memory stack, being repeated until all of said free memory stacks in each of said cache memory banks are linked together;
- (e) storing, in one of said pair of said free memory stacks in said shared memory area in one of said cache memory banks, a pointer to each said free data block in said one cache memory bank;
- (f) when said one of said free memory stacks in said shared memory contains a predetermined high threshold number of said pointers:
   (1) writing the contents of the other of said pair of free memory stacks in said shared memory to an empty area in said cache memory bank if said other stack is not empty, and
   (2) writing the contents of said one of said pair of said free memory stacks to an empty area in said cache memory bank, when said one free memory stack is full, said step of storing said pointers to said free data blocks then taking place in said other of said pair of said free memory stacks in said shared memory area, said step of storing a said pointer being repeatedly alternated between said pair of free memory stacks each time a said free memory stack in said shared memory becomes full;
- (g) initially repeating steps (e) and (f) for each said cache memory bank in said cache memory subsystem until pointers to all free data blocks in all of said cache banks are stored;
- (h) further repeating steps (e) and (f) whenever an additional said free data block becomes available;
- (i) locating a free data block in a given one of said cache memory banks by referring to a said pointer, in said free memory stack presently being used to store pointers in said shared memory;
- (j) writing, into a first empty one of said pair of said free memory stacks in said shared memory area, the contents of said first free memory stack located in said cache memory bank, when the number of pointers available for use in the second of said pair of free memory stacks, presently being used for storing said pointers, reaches a predetermined minimum number, and using said pointers in said first one of said pair of free memory stacks to locate additional said free data blocks when said second of said pair of free memory stacks becomes empty;
- (k) setting, to a disconnected state, disk drive connection indicator flag corresponding to said specified cache memory bank, when said specified cache memory bank is to be disconnected from said data storage system;
- (l) setting, to a connected state, said disk drive connection indicator flag corresponding to said specified cache memory bank, when said specified cache memory bank is to be connected to said data storage system; and
- (m) checking said disk drive connection indicator flag in each 9f said entries to determine whether said cache memory banks associated with each of said entries is connected to said data storage system before transferring data between said primary memory system and said cache memory bank.

5. The method of claim 4 further comprising the steps of:

defining, in each of the entries in said bank connection table, a count indicating the number of free data blocks available for use in the cache memory banks corresponding to each of the entries;

defining, in said shared memory area, an index pointer for pointing to any of said entries in said bank connection table, said pointer initially pointing to the first entry in the table;

referring to said index pointer to determine which one of said cache memory banks is currently being referenced for allocation of free data blocks;

incrementing said index pointer to the next of said entries in the bank connection table when the counter associated with the entry currently being pointed to by the index pointer indicates that all the free data blocks in the corresponding cache memory bank have been depleted; and resetting the index pointer to the first said entry in the table, when said step of incrementing takes place with the index pointer pointing to the last entry in the table.

6. The method of claim 5 including the additional step of:

defining a table map having one bit for each of the entries in the bank connection table, each said bit indicating whether the free data block count in the associated entry in the table is non-zero; and setting the index pointer to the first entry in the table having a non-zero count.

7. The method of claim 6 including the additional step of:

locating a said free data block by referring to said index pointer to locate a said bank connection table entry whose corresponding cache memory bank contains a said free data block.

8. In a data storage system comprised of a primary memory system and cache memory subsystem containing a plurality of banks of cache memory, a method for logically isolating a specified one of said cache memory banks from said data storage system and from all other said cache memory banks in said data storage system, said method comprising the steps of:

storing a set of data having a plurality of elements, each element indicative of a connection between said data storage memory system and one of said cache memory banks logically connected thereto;

setting a said indicative element associated with said specified cache memory bank to indicate a disconnected state, when said specified cache memory bank is to be disconnected from said data storage system;

setting a said indicative element associated with said specified cache memory bank to indicate a connected state, when said specified cache memory bank is to be connected from said data storage system; and checking the state of said indicative element to determine whether the cache memory bank associated therewith is connected to said data storage system before attempting to transfer data therebetween.

* * * * *